(12) United States Patent
Ishio et al.

(10) Patent No.: US 8,622,594 B2
(45) Date of Patent: Jan. 7, 2014

(54) LIGHT EMITTING ELEMENT MODULE AND MANUFACTURING METHOD THEREOF, AND BACKLIGHT APPARATUS

(75) Inventors: Toshiya Ishio, Osaka (JP); Yasuhiko Tanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 298 days.

(21) Appl. No.: 12/832,755

(22) Filed: Jul. 8, 2010

(65) Prior Publication Data

US 2011/0007493 A1 Jan. 13, 2011

(30) Foreign Application Priority Data

Jul. 10, 2009 (JP) ................................. 2009-164260

(51) Int. Cl.
*F21V 17/00* (2006.01)
*H01L 33/00* (2010.01)

(52) U.S. Cl.
USPC ............. 362/455; 362/235; 362/308; 257/98; 257/99

(58) Field of Classification Search
USPC .......................................... 362/294, 268, 455
See application file for complete search history.

(56) References Cited

U.S. PATENT DOCUMENTS

| | | | |
|---|---|---|---|
| 7,181,378 B2 * | 2/2007 | Benitez et al. ..................... 703/2 |
| 7,514,718 B2 | 4/2009 | Shin et al. | |
| 7,631,986 B2 * | 12/2009 | Harrah ........................... 362/230 |
| 7,800,124 B2 * | 9/2010 | Urano et al. ..................... 257/98 |
| 2004/0190304 A1 * | 9/2004 | Sugimoto et al. ............. 362/555 |
| 2005/0228097 A1 * | 10/2005 | Zhong ............................ 524/430 |
| 2005/0239227 A1 * | 10/2005 | Aanegola et al. ............... 438/26 |
| 2006/0066218 A1 | 3/2006 | Yamaguchi et al. | |
| 2007/0041210 A1 | 2/2007 | Ikuno et al. | |
| 2007/0205425 A1 | 9/2007 | Harada | |
| 2007/0284714 A1 * | 12/2007 | Sakakibara et al. .......... 257/680 |
| 2008/0210962 A1 | 9/2008 | Blumel et al. | |
| 2009/0095967 A1 * | 4/2009 | Masui et al. .................... 257/98 |
| 2011/0085336 A1 | 4/2011 | Blumel et al. | |

FOREIGN PATENT DOCUMENTS

| | | |
|---|---|---|
| CN | 2426640 | 4/2001 |
| JP | 2006-92983 A | 4/2006 |
| JP | 2006-202894 A | 8/2006 |
| JP | 2006-269079 A | 10/2006 |
| JP | 2006-324283 A | 11/2006 |
| JP | 2007-72432 A | 3/2007 |
| JP | 2007-73825 A | 3/2007 |
| JP | 2007-266445 A | 10/2007 |
| JP | 2008-532300 A | 8/2008 |

(Continued)

*Primary Examiner* — Sikha Roy
(74) *Attorney, Agent, or Firm* — Birch, Stewart, Kolasch & Birch, LLP

(57) ABSTRACT

A light emitting element module with a high yield where a portion through which a substrate and a lens are bonded can be prevented from cracking and peeling due to thermal expansion is provided. A light emitting element part equipped with a light emitting element and an optical lens for diffusing light from the light emitting element are provided on a substrate in the light emitting element module, where the lens is fixed to the substrate with an adhesive resin having a tensile breaking elongation of 50% or more. The lens also has a plurality of supports and is fixed to the substrate through these supports, so that stress in the portion where the substrate and the lens are bonded can be dispersed between the supports, and a layer in which air can circulate so as to release heat is provided between the substrate and the lens.

7 Claims, 6 Drawing Sheets

(56) References Cited

FOREIGN PATENT DOCUMENTS

| | | |
|---|---|---|
| JP | 2008-305940 A | 12/2008 |
| JP | 2009230984 A * | 10/2009 |
| KR | 10-0662844 B1 | 1/2007 |
| KR | 10-0706942 B1 | 4/2007 |
| WO | WO 2006109113 A2 * | 10/2006 |

* cited by examiner

Results of Temperature Cycling Test for Adhesive Resins

| Adhesive Resin | | A<br>Epoxy Based | B<br>Epoxy Based | C<br>Acryl Modified Silicone | D<br>Acryl Modified Silicone | E<br>Silicone Based | F<br>Polyurethane |
|---|---|---|---|---|---|---|---|
| Elongation at Break (%) | | 4 | 50 | 175 | 220 | 290 | 750 |
| Curing Temperature (°C) | | 80°C | 80°C | Moisture Curing | Moisture Curing | Moisture Curing | Moisture Curing |
| Distance between Supports | 9 mm | — | ○ | — | — | — | — |
| | 13 mm | — | ○ | — | — | — | — |
| | 15 mm | × | ○ | ○ | ○ | ○ | ○ |

−40°C/85°C (20 minutes/time) at 300 cycles    ○: There is no fracture.   ×: There are some fractures.

Fig. 3

LIGHT EMITTING ELEMENT MODULE AND MANUFACTURING METHOD THEREOF, AND BACKLIGHT APPARATUS

CROSS REFERENCE TO RELATED APPLICATION

This Nonprovisional application claims priority under 35 U.S.C. §119(a) on Patent Application No. 2009-164260 filed in Japan on 10 Jul., 2009 the entire contents of which are hereby incorporated by reference.

BACKGROUND OF THE INVENTION

1. Field of the Invention

The present invention relates to a light emitting element module equipped with a light emitting element and a manufacturing method thereof, as well as a backlight apparatus for use in a liquid crystal display device, such as a liquid crystal television or a liquid crystal monitor using the light emitting element module.

2. Description of the Related Art

Liquid crystal display devices, such as liquid crystal televisions and liquid crystal monitors, require a light source for illuminating the display from the rear, because the liquid crystal itself does not emit light. A solid state light emitting element, such as a fluorescent tube, or LEDs (light emitting diodes) is used as the light source, and in either case, measures for making the light uniform within the display area are required.

FIG. 6 shows a structure of a substrate equipped with a conventional light emitting element (light emitting element module). As disclosed in Japanese Unexamined Patent Publication 2008-305940, an LED 5 provided directly on a substrate 11, and the substrate 11 and the LED 5 are connected with wires 8, and furthermore, a cap 41 having a lens portion 41a and a reflector portion 41b that are molded together is bonded to the substrate using an adhesive resin 32 in order to protect the LED 5 and the wires 8, and moreover, a transparent sealing resin 42 is injected into the cap 41 and thermally cured, and thus the module is completed.

In the case of the above described related art, however, there is stress in the portion through which the cap 41 and the substrate 11 are bonded together, due to the difference in the coefficient of thermal expansion between the cap and the substrate (difference in the degree of thermal expansion/contraction) when the temperature changes, and a problem arises, such that the adhesive resin portion 32 between the substrate 11 and the cap 41 cracks and peels when the temperature changes repeatedly.

Furthermore, there is a problem with the precision in the border portion between the two color molds when the lens portion 41a and the reflector portion 41b in the cap are molded together, and this affects the yield. Moreover, the LED 5 is mounted on the substrate and connected with the wires 8, and thereafter molded in a resin by injecting a transparent liquid resin 42. As a result, there arises a problem such that bubbles are created or the resin foams when the transparent liquid resin 42 is injected into the cap 41 and thermally cured, which makes the yield of light emitting element modules very poor.

SUMMARY OF THE INVENTION

The present invention is provided in view of the problems with the related art, and an object thereof is to provide a light emitting element module with a high yield, where a portion where a substrate and a lens are bonded together can be prevented from cracking or peeling due to thermal expansion.

In order to achieve the above object, a light emitting element module according to the present invention comprises: a light emitting element part equipped with a light emitting element; and an optical lens for diffusing light from the light emitting element, which are mounted on a substrate, and is first characterized in that the adhesive resin for fixing the optical lens to the substrate has a tensile breaking elongation of 50% or more.

In addition to the first characteristic, the light emitting element module according to the present invention is second characterized in that the optical lens has a plurality of supports which protrude from an outer peripheral portion toward the substrate, and the supports are bonded to the substrate using the adhesive resin so that the optical lens is fixed to the substrate.

In addition to the first or second characteristics, the light emitting element module according to the present invention is third characterized in that the adhesive resin is any one of an epoxy based thermosetting resin and silicone based, acryl modified silicone based and urethane based moisture curing resins.

In addition to any of the first to third characteristics, the light emitting element module according to the present invention is fourth characterized in that the light emitting element part is configured such that the light emitting element is sealed in a transparent resin.

The backlight apparatus according to the present invention is a backlight apparatus for a liquid crystal display device using a light emitting element module having any of the first to fourth characteristics.

A manufacturing method for a light emitting element module according to the present invention is a method for manufacturing a light emitting element module having any of the first to fourth characteristics, and first characterized by comprising: preparing a light emitting element part where a light emitting element is sealed in a transparent resin; preparing a substrate where lands for mounting wires and the light emitting element part on the substrate are formed; preparing an optical lens; mounting the light emitting element part on the lands on the substrate; and fixing the optical lens on the substrate for each light emitting element part using an adhesive resin having a tensile breaking elongation of 50% or more.

In addition to the first characteristic, the manufacturing method for a light emitting element module according to the present invention is second characterized in that an optical lens having a plurality of supports which protrude from an outer peripheral portion toward the substrate is prepared in the step of preparing the optical lens, and the supports of the optical lens are fixed to the substrate using the adhesive resin in the step of fixing the optical lens.

In addition to the first or second characteristic, the manufacturing method for a light emitting element module according to the present invention is third characterized in that the optical lens is fixed using the adhesive resin which is a thermosetting resin and has a curing temperature of 90° C. or lower in the step of fixing the optical lens.

In addition to the first or second characteristic, the manufacturing method for a light emitting element module according to the present invention is fourth characterized in that the optical lens is fixed using the adhesive resin which is a moisture curing resin in the step of fixing the optical lens.

According to the present invention, in the light emitting element module where a light emitting element part equipped with a light emitting element and an optical lens for diffusing light from the light emitting element are provided on a substrate, the optical lens is fixed to the substrate using an adhesive resin having a tensile breaking elongation of 50% or more, so that the stress caused by the difference in the coefficient of thermal expansion between the substrate and the optical lens is absorbed in the portion through which the substrate and the optical lens are bonded together, and thus, the portion through which the substrate and the optical lens are bonded together can be prevented from cracking and peeling. As a result, the light emitting element module can be fabricated with high yield.

As adhesive resins having such a tensile breaking elongation, epoxy based thermosetting resins or silicone based, acryl modified silicone based or urethane based moisture curing resins can be used, for example. In the case where a thermosetting adhesive resin is used from among these, it is preferable to cure the resins at a lower temperature, because there is less stress after thermosetting followed by cooling. Particularly in the case where an acryl based resin is used as the material for the optical lens, a heating process of 90° C. or higher is not desirable, because there is a risk that the optical lens may be deformed by the heat, and it is desirable to fix the lens to the substrate by heating it to 90° C. or less using a thermosetting resin that cures at a temperature of 90° C. or lower. Meanwhile, in the case where a moisture curing adhesive resin is used, it is possible to cure it at a temperature of as low as 40° C. to 60° C., or at room temperature, in which case the curing process is somewhat more lengthy, and thus, there is even less stress on the adhesive resin.

Furthermore, the optical lens has such as structure as to have a plurality of supports and fixed to the substrate by means of these supports, so that the stress in the portion through which the substrate and the optical lens are bonded together can be dispersed between the supports. In addition, the substrate and the optical lens are bonded together by means of the supports, so that there is a layer as wide as the length of the supports through which air can circulate between the substrate and the optical lens, and thus, the heat releasing properties are better than in the case where the light emitting element part is tightly sealed, as in the related art. As a result, the temperature of the light emitting element module can be prevented from changing as the light emitting element is turned ON/OFF for normal use, and stress can be prevented.

In addition, the light emitting element has such a structure as to be molded in a transparent resin and mounted in the light emitting element part, and therefore, good light emitting element parts can be selected when mounted on a substrate, and thus the yield of light emitting element modules can be prevented from lowering.

Accordingly, the present invention can provide a light emitting element module with high yield, where the portion through which the substrate and the optical lens are bonded together can be prevented from cracking and peeling due to thermal expansion. The above-described light emitting element module can be used as a backlight apparatus for the backlight of a liquid crystal display device, such as a liquid crystal television or a liquid crystal monitor.

BRIEF DESCRIPTION OF THE DRAWINGS

FIG. 3 is a table showing results of a reliability test for adhesion of adhesive resins;

DETAILED DESCRIPTION OF THE INVENTION

First Embodiment

Figure 1:
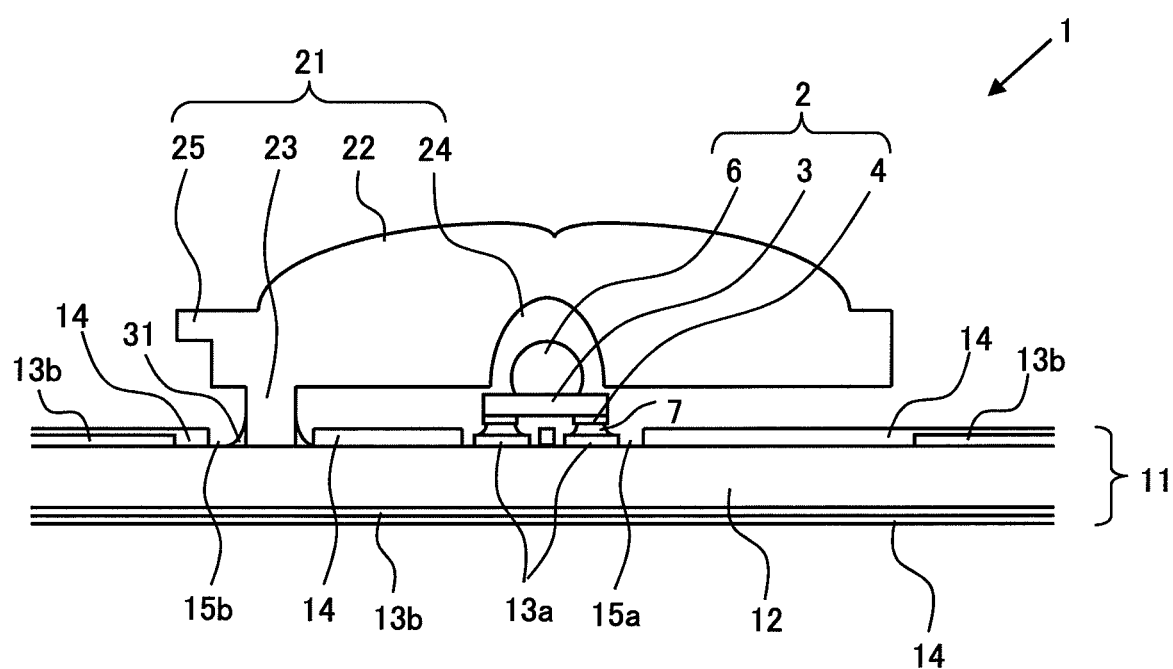
FIG. 1 is a cross sectional view showing a light emitting element module according to the present invention.

FIG. 1 shows an example of a structure of a light emitting element module 1 according to one embodiment of the present invention. FIG. 1 is a cross sectional view showing the light emitting element module 1 according to the present embodiment as cut perpendicular to the substrate. A plurality of light emitting element parts 2 each equipped with an LED as a light emitting element are mounted on a substrate 11 in one or more rows, but FIG. 1 shows only one light emitting element part 2. The other drawings focus on the main portion thereof. The dimensions of the components in the drawings do not necessarily match real dimensions.

The light emitting element part 2 is formed so that one or more LED chips (not shown) are mounted on a component substrate 3, such as of ceramic, and electrically connected to the component substrate 3 with wires (not shown), and the LED chips and wires are sealed in a sealing resin 6. In addition, the light emitting element part 2 is connected to a substrate 11 through component terminals 4 using a conductive material 7, such as solder, which is on the lands 13a on the substrate 11, and in such a location that the center of the optical lens 21 is substantially above the center of the light emitting element part 2. A transparent resin, for example a silicone based resin, is used as the sealing resin 6, and a fluorescent body is added if necessary. As described above, a light emitting element part 2 where an LED chip is sealed in a transparent resin is fabricated in advance, and the light emitting element part 2 is mounted on the substrate 11 when it is a good product, so that the yield of light emitting element modules 1 equipped with a great number of LEDs can be prevented from lowering.

The substrate 11 is fabricated by carrying out a wiring process on a base 12 formed by impregnating woven or unwoven glass fibers or organic material fibers with a resin (epoxy resin or cyanate resin), for example. Copper is used for wires 13 (13a, 13b). The surface of the wires may be plated with gold. In addition, the heat emission of the light emitting element part 2 is relatively high, and therefore, the wires can be provided on both surfaces of the substrate 11. Lands 13a are provided where the light emitting element part 2 is mounted so as to correspond to the location of the component terminals 4. A white insulating material (white resist or the like) 14 is formed on the outermost surface of the substrate so as to cover the wires 13b. Because the outermost surface of the substrate 11 is covered with a white insulating material 14, the wires can be protected, and in addition, the reflectance for light from the light emitting element is higher, and the display area is irradiated with more light. It should be noted that a normal solder resist may be used in the case where a reflective sheet is separately provided on the surface of the substrate.

The substrate 11 has openings 15a and 15b which are not covered with the insulating material 14, so that the light emitting element part 2 can be connected to the land 13a on the substrate 11 through the opening 15a, and the optical lens 21 can be fixed to the base 12 on the substrate 11 with the adhesive resin 31 through the opening 15b. Here, the adhesive resin 31 is an adhesive resin with a high expansion ratio having a tensile breaking elongation of 50% or more. The opening 15b may have the same size or be slightly larger than the bottom of a support 23 for the optical lens. Thus, an opening that is the same size or slightly larger than the bottom of the support 23 is provided in the insulating material, so that the adhesive resin 31 is easier to position and the amount of resin is also easy to control. The coefficient of thermal expansion is approximately $1\times10^{-5}/°$ C. to $3\times10^{-5}/°$ C. when the substrate 11 is made of resin, and approximately $5\times10^{-6}/°$ C. when it is made of ceramic.

Figure 2A:
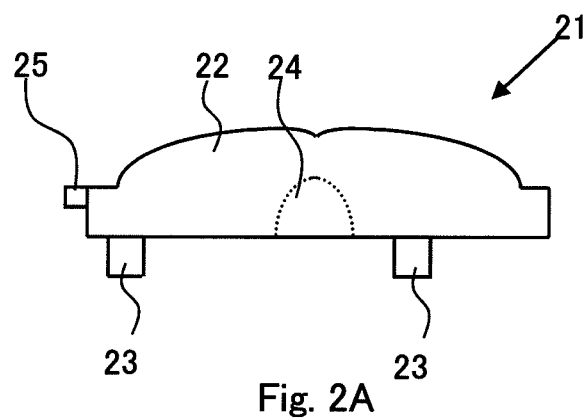
FIG. 2 is a view showing a shape of an optical lens provided in the light emitting element module according to the present invention.
Figure 2B:
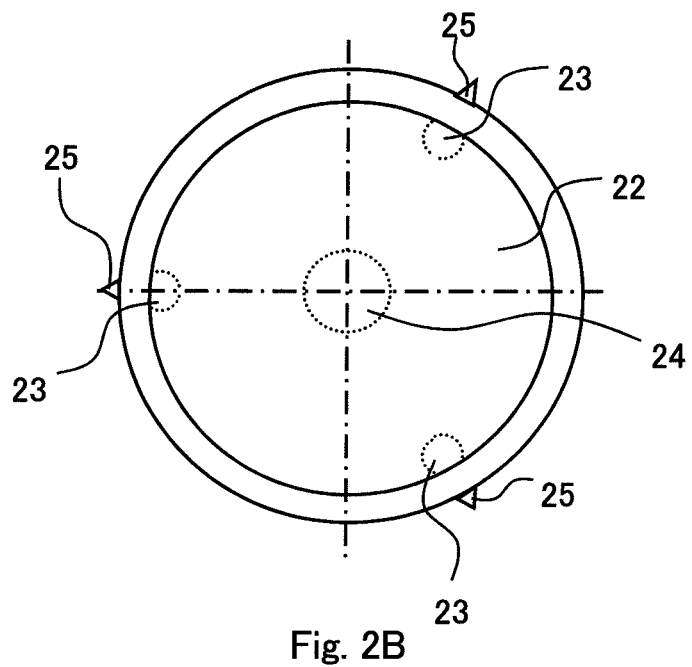

Acryl based resins, polycarbonate and methacryl, which are highly transparent, can be used for the optical lens 21, in addition to styrene based and epoxy based resins. The coefficient of thermal expansion of these materials is approximately $6\times10^{-5}/°$ C. to $8\times10^{-5}/°$ C. FIG. 2 shows the shape of the optical lens 21. FIG. 2A is a side view and FIG. 2B is a top view. As shown in FIGS. 2A and 2B, the optical lens 21 is fabricated so as to have a lens portion 22, supports 23, a recess 24 and marks 25, and molded into a single piece through injection molding using a die.

Simulation or the like is carried out in advance in order to determine an appropriate shape for the lens portion 22, which should be designed so as to be aspherical so that light can be diffused.

A plurality of supports 23 are provided in order to fix the optical lens 21 to the substrate 11 using an adhesive resin 31. It is desirable that three or more supports are provided, because this makes it easy to attach the lens to the substrate 11 horizontally. All of the supports 23 may be fixed to the substrate 11 using the adhesive resin 31, but at least two of the supports are desirably fixed in order to prevent the optical lens 21 from rotating.

Here, the supports 23 function to disperse among themselves the stress in the portion through which the substrate 11 and the optical lens 21 are bonded resulting from the difference in the coefficient of thermal expansion. The stress is caused when the size (distance between the supports 23) changes, when the temperature changes after the optical lens 21 is bonded to the substrate 11 (the temperature changes during cooling after the heat treatment for curing the adhesive resin 31 and the light emitting element part 2 and other parts are repeatedly heated and cooled through the turning ON/OFF of the display device). Accordingly, the taller the supports 23 are, the more the stress in the bonded portion can be dispersed between them.

Furthermore, when the substrate 11 and the optical lens 21 are bonded together through the supports 23, there is a layer as wide as the height of the supports in which air can circulate between the substrate 11 and the optical lens 21, and thus, the heat releasing properties of the light emitting element module 1 are better.

Various shapes, such as circular, elliptical, triangular, square, rectangular, polygonal, and the like are possible for the cross section of the supports 23 as cut parallel to the upper surface of the substrate 11, but it is desirable for the width of the cross section in the direction in which the center of the optical lens 21 and the center of the support 23 are connected (that is, the direction of the radius of the lens) to be approximately 0.5 mm to 5 mm. In the case where the supports 23 are too wide in the direction in which the center of the optical lens 21 and the center of the support 23 are connected, there is an optical effect, while in the case where they are too narrow, the intensity is low. Meanwhile, the width may be relatively great in the direction perpendicular to the line connecting the center of the optical lens 21 and the center of the support 23 (that is, the direction of the outer periphery of the lens), and it is desirable for the width of the cross section to be approximately 0.5 mm to 10 mm. Although the optical effect is small in the direction perpendicular to the line connecting the center of the optical lens 21 and the center of the support 23, the heat releasing properties are affected when the width of the supports is too great in a cross section, because air cannot circulate. However, even in the case where the width exceeds 10 mm in a cross section, the layer allows air to circulate more than in the case where the light emitting element part is tightly sealed, and thus, the heat releasing properties are improved.

Although it is desirable for the supports 23 to be as high as possible in order to reduce the stress on the adhesive resin 31, the height should be determined taking into consideration the thickness of the display device in which the light emitting element module 1 is mounted and the height at which the light emitting element is mounted, and approximately 0.1 mm to 5 mm is generally appropriate. In addition, the greater the distance is between the supports 23, which are fixed using the adhesive resin 31, the greater the stress applied on the adhesive resin 31, and therefore, it is desirable for the distance between supports to be 20 mm or less.

A recess 24 for containing a part of the light emitting element part 2 is created in the center portion of the optical lens 21, and the light emitting element part 2 is not sealed tightly, so that there is an air layer between the light emitting element part 2 and the recess 24, so that the heat releasing properties of the light emitting element part 2; that is, the heat releasing properties of the light emitting module 1 as a whole, are better.

The marks 25 are used as alignment marks when the optical lens 21 is mounted on the substrate 11. The marks 25 have such a structure as to protrude outward from the outer periphery of the optical lens 21, and are provided outside the supports 23 along lines extending through the center of the optical lens 21 and the center of each of the three supports. The shape of the marks 25 is triangular or rectangular as viewed from the front of the optical lens 21, and may be any shape that allows the marks to be distinguished from the shape of the gate cutting portion (not shown) after the optical lens is molded. In the present embodiment, the gate cutting portion is rectangular, and therefore, the marks 25 are triangular in shape.

FIG. 3 shows results of a reliability test for the adhesion of the adhesive resin 31. FIG. 3 shows the results of examination of the peeling for each adhesive resin 31 after an optical lens 21 made of an acryl based resin (having a coefficient of thermal expansion of $6.0\times10^{-5}/°$ C.) is bonded and fixed to a composite substrate (having a coefficient of thermal expansion of $2.5\times10^{-5}/°$ C.) formed by impregnating glass fibers with an epoxy resin through supports 23 and a temperature cycling test is carried out (300 times for 20 minutes each at $-40°$ C./$85°$ C.). There are six types of adhesive resins 31, indicated by A to F in FIG. 3, which were selected from adhesive resins that cure at $90°$ C. or lower. The test was carried out on optical lenses 21 where the distance between the center of the supports 23 was 9 mm, 13 mm and 15 mm, with two supports being fixed using the adhesive resin 31. In this case, the optical lens 21 was provided with at least three supports 23 so as to be parallel to the upper surface of the substrate 11.

It should be noted that the adhesive resins B to F, which had a tensile breaking elongation of 50% or more, did not peel when the distance between the supports was 15 mm. The materials C to F, which had a tensile breaking elongation of 175% or more, did not peel when the distance between the supports was 15 mm and the temperature was changed 1000 cycles or more. Furthermore, it is possible to cure the materials C to F, which cure through moisture, at a temperature of as low as 40° C. to 60° C., and furthermore, they can be cured at room temperature, which requires a more lengthy process of 8 hours or more.

Second Embodiment

Figure 4:
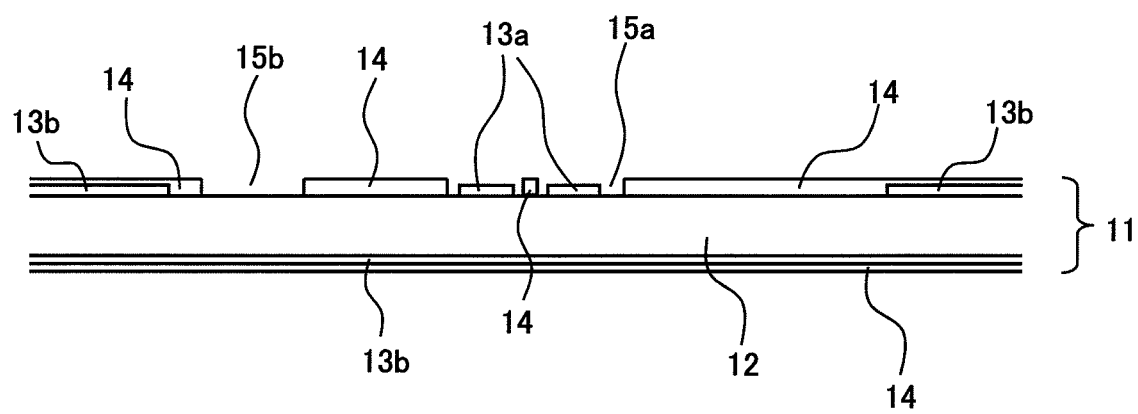
FIG. 4 is a view showing a manufacturing step for the light emitting element module according to the present invention.
Figure 5:
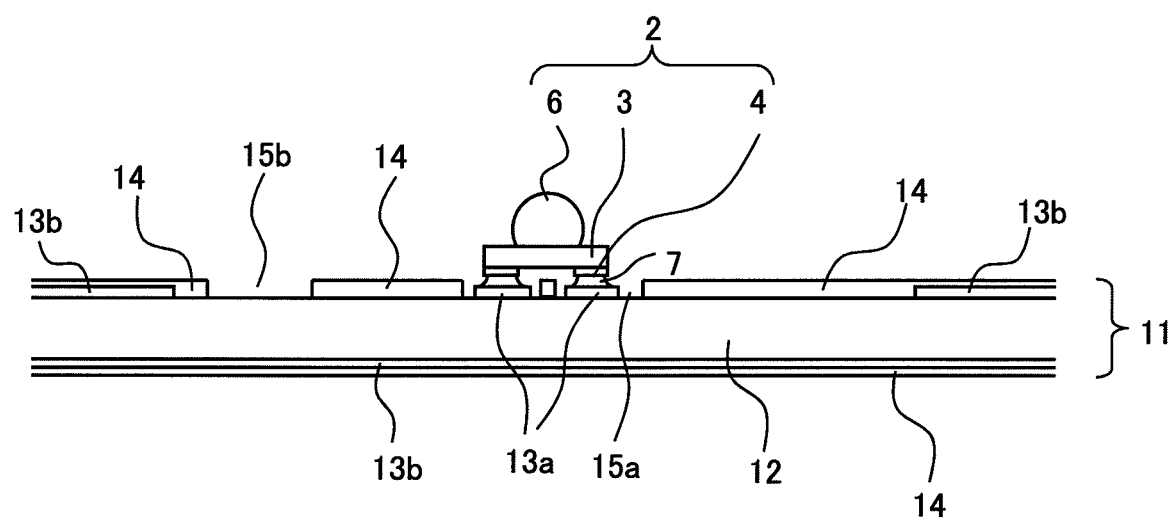
FIG. 5 is a view showing another manufacturing step for the light emitting element module according to the present invention.
Figure 6:
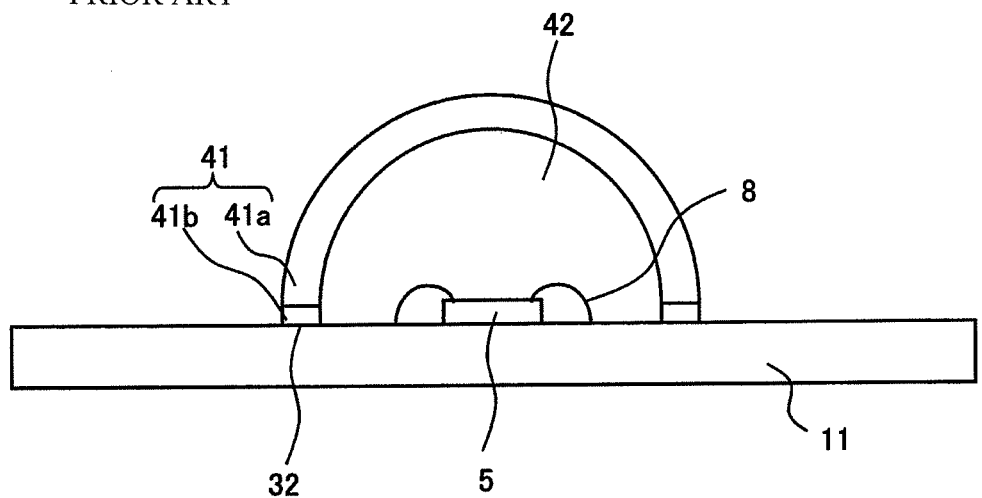
FIG. 6 is a cross sectional view showing a light emitting element module according to the related art.

Next, the manufacturing method for the light emitting element module 1 is described. FIGS. 4 and 5 are views showing the manufacturing steps for the light emitting element module 1 in FIG. 1.

First, a light emitting element part 2, a substrate 11, and an optical lens 21 are prepared. Here, the substrate 11 is a resin substrate where epoxy and glass fibers are combined, for example, and FIG. 4 is a cross sectional view of the substrate 11. Wires 13 are formed on both surfaces of the substrate 11. The wires 13 can be formed of a material such as copper, nickel, or gold. Lands 13a in the wires 13 on which the light emitting element part 2 is mounted are formed on one surface of the substrate 11, and the wiring portions 13b are formed on both surfaces. In addition, a wiring portion 13b is provided over the entire surface on which the light emitting element part 2 is not mounted, so that the substrate 11 has better heat releasing properties. The solder resist 14 covers all of the wires 13b formed on both surfaces so as to protect the wiring portions 13b, and openings 15a and 15b are provided in portions where the lands 13a and the supports 23 of the optical lens 21 are provided, respectively.

The light emitting element part 2 is formed so that one or more LED chips (not shown) are mounted on a component substrate 3 made of ceramic and electrically connected by means of wires (not shown) or the like, and the LED chips and the wires are sealed in a sealing resin 6.

The optical lens 21 is molded through an injection molding or the like, using a die, so that the lens portion 22, the supports 23, the recess 24 and the marks 25 are integrated. The supports 23 and the marks 25 may be attached afterward, but are desirably integrated with the mold, which makes the process easier since only one material is used. In the case where a satin finish is provided on the bottom of the lens portion 22, the discreteness and radiation of light are higher.

Next, the light emitting element part 2 is mounted on the substrate 11. FIG. 5 is a cross sectional view showing the substrate 11 on which the light emitting element part 2 is mounted. The surface of the component substrate 3 in the light emitting element part 2 is provided with component terminals 4 made of copper, silver, nickel or gold, so that the light emitting element part 2 is mounted on the lands 13a of the substrate 11 using a conductive material 7 made of solder of a conductive adhesive material. The conductive material 7 may be provided on the component terminals 4 or the lands 13a, or on both. The conductive material is heat treated through reflow or in an oven, so that the light emitting element part 2 is fixed to the substrate 11.

Next, the optical lens 21 is fixed to the substrate 11 using an adhesive resin 31. The adhesive resin 31 is an adhesive resin with a high expansion ratio and a tensile breaking elongation of 50% or more after adhesion, as described above.

An appropriate amount of the adhesive resin 31 is supplied on the substrate 11 through the opening 15b in FIG. 5, so that the bottom of the supports 23 of the optical lens 21 can be bonded to the substrate. In the case where the adhesive resin 31 is liquid, the adhesive resin 31 can be supplied to the substrate 11 at the point where the optical lens is bonded thereto by using a dispensing method, a printing method or the like. In the case where the adhesive resin 31 is in sheet form or tape form, it can be supplied through temporary contact bonding. Methods for applying a liquid adhesive resin 31 using the dispensing method are easy and desirable in the manufacture.

The adhesive resin 31 is supplied only in bonded portions (the bottom of all of the supports 23, or at least two of them), and therefore, it is possible to use less adhesive resin than in the case where the entire peripheral portion of the lens is bonded, as in the related art.

Next, the optical lens 21 is fixed to the substrate 11 using a general mounting machine, such as a die bonder or a mounter. The marks 25 are used as alignment marks at this time.

In the case where an epoxy based thermosetting adhesive resin (B in FIG. 3) is used as the adhesive resin 31, the adhesive resin can be cured through heat treatment for 5 minutes at 80° C., which is lower than 90° C., after the lens 21 is mounted. Accordingly, there is little stress after thermosetting followed by cooling, in comparison with general adhesive resins which cure thermally at a high temperature of 150° C. or higher. In addition, thermosetting is carried out for a short period of time, for example for approximately 5 minutes, and therefore, it is possible to cure the resin not only in an oven but also on a hot plate or in a reflow furnace.

In addition, in the case where a moisture curing adhesive resin such as a silicone based resin or polyurethane (C to F in FIG. 3) is used as the adhesive resin 31, the adhesive resin 31 can be cured at a lower temperature of 40° C. to 60° C. When the adhesive resin 31 can be cured for a longer period of time, such as approximately 8 hours, the adhesive resin 31 can be cured at room temperature, and the stress on the adhesive resin 31 can be further reduced.

In the above described process, the optical lens 21 is bonded to the substrate 11 via the supports 23 so as to be fixed to the substrate 11 so that the center of the optical lens 21 is substantially above the center of the light emitting element part 2, and as a result, a light emitting element module 1 where the light emitting element part 2 and the optical lens 21 are mounted on the substrate 11, as shown in FIG. 1, is manufactured. The light emitting element module 1 is fixed to the chassis of a liquid crystal display device, for example a liquid crystal television or a liquid crystal monitor, with rivets, and thus can be used as a backlight unit.

It should be noted that the above-described embodiments are examples of the preferred embodiments of the present invention. The embodiments of the present invention are not limited thereto, and various modifications are possible, as long as it does not deviated from the gist of the present invention.

Other Embodiments

In the following, other embodiments are described.

(1) Although in the first and second embodiments, the optical lens 21 is fixed to the substrate 11 when the supports 23 of the optical lens 21 are bonded to the base 12 of the substrate 11 using the adhesive resin 31 through the opening 15b opened in the insulating material (solder resist) 14, the supports 23 of the optical lens 21 may be fixed to the insulating material (solder resist) 14 using the adhesive resin 31 without providing an opening 15b. In this case, if the area in which the supports 23 are placed is marked, the positioning of the bonded portions and the control of the amount of resin supplied are easy when the adhesive resin 31 is supplied. However, in cases where the adhesion between the insulating material 14 and the base 12 is not very good, it is desirable to provide an opening in the insulating material 14.

(2) Although the light emitting element module 1 may be one module on which an appropriate number of light emitting element parts 2 for the entire display screen are mounted, in this case, the substrate 11 needs to correspond in size to the display screen, and it is necessary to change the substrate 11 for different screen sizes. Therefore, it is desirable to prepare a plurality of basic light emitting element modules of a plurality of types on which several or several tens of light emitting element parts 2 are mounted, so that a plurality of basic light emitting element modules are combined for use in accordance with the screen size, so that a light emitting element module 1 having a desired display screen size can be formed. For example, three types of basic light emitting element modules on which five, six and eight light emitting element parts 2 are mounted may be prepared, so that various display screen sizes are provided. As a result, the individual modules are small in size, and the plurality of light emitting element parts 2 that are mounted on the individual modules is also small, and therefore, the light emitting element module 1 can be manufactured without lowering the yield. The basic light emitting element modules are connected by means of jumper lines, connecters, or the like in order to form the light emitting element module 1. The structure of the light emitting element parts 2 and the optical lenses 21 in the basic light emitting element modules, as well as the method for fixing to the substrates, are the same as in the light emitting element modules 1 according to the first and second embodiments, and the description thereof is not given.

The present invention can be applied to light emitting element modules on which light emitting elements are mounted, and in particular to backlight apparatuses for liquid crystal display devices, such as liquid crystal televisions and liquid crystal monitors.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A light emitting element module comprising:
   a light emitting element part equipped with a light emitting element; and
   an optical lens for diffusing light from the light emitting element, wherein
   the light emitting element part and the optical lens are provided on a substrate, and
   the optical lens is fixed to the substrate using an adhesive resin having a tensile breaking elongation of 50% or more,
   wherein the optical lens has at least three pillar supports which protrude from an outer peripheral portion toward the substrate,
   at least two of the at least three pillar supports are bonded to the substrate using the adhesive resin so that the optical lens is fixed to the substrate, while at least one of the at least three pillar supports is not bonded to the substrate using the adhesive resin, and
   a space is defined between the substrate and the optical lens for allowing external air to circulate therethrough.

2. The light emitting element module according to claim 1, wherein the adhesive resin is any one of an epoxy based thermosetting resin and silicone based, acryl modified silicone based and urethane based moisture curing resins.

3. The light emitting element module according to claim 1, wherein the light emitting element part is configured such that the light emitting element is sealed in a transparent resin.

4. A backlight apparatus for a liquid crystal display device, comprising:
   the light emitting element module according to claim 1.

5. A method for manufacturing the light emitting element module comprising:
   preparing a light emitting element part where a light emitting element is sealed in a transparent resin;
   preparing a substrate where lands for mounting wires and the light emitting element part on the substrate are formed;
   preparing an optical lens;
   mounting the light emitting element part on the lands on the substrate; and
   fixing the optical lens on the substrate for the light emitting element part using an adhesive resin having a tensile breaking elongation of 50% or more,
   wherein the optical lens having at least three pillar supports which protrude from an outer peripheral portion toward the substrate is prepared in the step of preparing the optical lens,
   in the step of fixing the optical lens, at least two of the at least three pillar supports of the optical lens are fixed to the substrate using the adhesive resin, while at least one of the at least three pillar supports of the optical lens is not fixed to the substrate using the adhesive resin, and
   a space is defined between the substrate and the optical lens for allowing external air to circulate therethrough.

6. The method for manufacturing a light emitting element module according to claim 5, wherein
   the optical lens is fixed using the adhesive resin which is a thermosetting resin and has a curing temperature of 90° C. or lower in the step of fixing the optical lens.

7. The method for manufacturing a light emitting element module according to claim 5, wherein
   the optical lens is fixed using the adhesive resin which is a moisture curing resin in the step of fixing the optical lens.

* * * * *